United States Patent
Yin et al.

(10) Patent No.: US 6,291,363 B1
(45) Date of Patent: Sep. 18, 2001

(54) SURFACE TREATMENT OF DARC FILMS TO REDUCE DEFECTS IN SUBSEQUENT CAP LAYERS

(75) Inventors: Zhiping Yin; Gurtej Singh Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/259,713

(22) Filed: Mar. 1, 1999

(51) Int. Cl.$^7$ .......................... H01L 21/31; H01L 21/469
(52) U.S. Cl. .......................... 438/769; 438/770; 438/771; 438/783; 438/786
(58) Field of Search ..................... 438/769–771

(56) References Cited

U.S. PATENT DOCUMENTS

| | | | |
|---|---|---|---|
| Re. 36,050 | 1/1999 | Thakur et al. | 374/161 |
| 4,952,526 | 8/1990 | Pribat et al. | 437/89 |
| 5,032,233 | 7/1991 | Yu et al. | 204/192.28 |
| 5,094,977 | 3/1992 | Yu et al. | 437/174 |
| 5,102,830 | 4/1992 | Sandhu | 437/173 |
| 5,124,780 | 6/1992 | Sandhu et al. | 357/67 |
| 5,138,411 | 8/1992 | Sandhu | 357/23.6 |
| 5,139,967 | 8/1992 | Sandhu et al. | 437/173 |
| 5,226,930 | 7/1993 | Sasaki | 51/308 |
| 5,320,880 | 6/1994 | Sandhu et al. | 427/578 |
| 5,341,016 | 8/1994 | Prall et al. | 257/412 |
| 5,344,792 | 9/1994 | Sandhu et al. | 437/200 |
| 5,350,236 | 9/1994 | Thakur et al. | 374/161 |
| 5,376,405 | 12/1994 | Doan et al. | 427/126.1 |
| 5,376,593 | 12/1994 | Sandhu et al. | 437/242 |
| 5,392,189 | 2/1995 | Fazan et al. | 361/305 |
| 5,438,019 | 8/1995 | Sandhu | 437/101 |
| 5,506,166 | 4/1996 | Sandhu et al. | 437/60 |
| 5,576,071 | 11/1996 | Sandhu | 427/534 |
| 5,618,349 | * 4/1997 | Yuuki | 118/715 |
| 5,723,382 | 3/1998 | Sandhu et al. | 438/653 |
| 5,731,235 | 3/1998 | Srinivasan et al. | 438/253 |
| 5,741,546 | 4/1998 | Sandhu | 427/255 |
| 5,747,116 | 5/1998 | Sharan et al. | 427/534 |
| 5,773,363 | 6/1998 | Derderian et al. | 438/672 |
| 5,800,617 | 9/1998 | Sandhu | 118/722 |
| 5,812,360 | 9/1998 | Sandhu et al. | 361/321.4 |
| 5,827,781 | 10/1998 | Skrovan et al. | 438/692 |
| 5,846,881 | 12/1998 | Sandhu et al. | 438/683 |
| 5,849,628 | 12/1998 | Sandhu et al. | 438/488 |
| 5,851,896 | 12/1998 | Summerfelt | 438/396 |
| 5,854,734 | 12/1998 | Sandhu et al. | 361/321.5 |
| 5,856,263 | 1/1999 | Lai et al. | 438/681 |
| 5,882,978 | 3/1999 | Srinivasan et al. | 438/396 |
| 5,907,183 | * 5/1999 | Takeuchi | 257/640 |
| 5,913,149 | 6/1999 | Thakur et al. | 438/762 |
| 5,949,117 | 9/1999 | Sandhu et al. | 257/410 |
| 6,030,541 | * 2/2000 | Adkisson et al. | 216/51 |
| 6,060,132 | * 5/2000 | Lee | 427/255 |
| 6,136,728 | * 10/2000 | Wang | 438/773 |

* cited by examiner

*Primary Examiner*—Eddie Lee
*Assistant Examiner*—Paul E Brock, II
(74) *Attorney, Agent, or Firm*—Schwegman, Lundberg, Woessner & Kluth, P.A.

(57) ABSTRACT

The present invention comprises a method for preventing particle formation in a substrate overlying a DARC coating. The method comprising providing a semiconductor construct. A DARC coating is deposited on the construct with a plasma that comprises a silcon-based compound and $N_2O$. The DARC coating is exposed to an atmosphere that effectively prevents a formation of defects in the substrate layer. The exposed DARC coating is overlayed with the substrate.

21 Claims, 3 Drawing Sheets

SURFACE TREATMENT OF DARC FILMS TO REDUCE DEFECTS IN SUBSEQUENT CAP LAYERS

FIELD OF THE INVENTION

The present invention relates to a method for treating deposited anti-reflective films, DARC films, to reduce defects in overlaying cap layers device comprising a DARC film, the device having reduced defects in a cap layer, overlaying the DARC film.

BACKGROUND OF THE INVENTION

Photolithographic techniques have wide use in fabrication of semiconductor devices, particularly in a fabrication of miniaturized electronic components. Photolithography processes comprise applying a photoresist composition to a substrate material, such as a silicon wafer. Once applied, the photoresist is fixed to the substrate to form a composite. The composite of substrate and photoresist is subjected to an image-wise exposure of radiation.

The radiation exposure causes a chemical transformation in the exposed areas of the photoresist covered surface. Visible light, ultraviolet (UV) light, electron beam and x-ray radiant energy are energy sources in wide use in photolithography. After image-wise exposure, the photoresist coated substrate is treated with a developer solution to dissolve and to remove either the radiation-exposed areas or the unexposed areas of the photoresist.

One problem encountered when using photolithographic techniques, particularly in fabricating microcomponents, is back reflectivity or back reflection of light. Back reflection is a cause of thin film interference and reflective notching. Thin film interference results in changes in critical line width dimensions caused by variations in the total light intensity in the resist film as the thickness of the resist film changes. Reflective notching occurs when the photoresist is patterned over substrates containing topographical features, which scatter light throughout the photoresist film, leading to line width variations. In an extreme case, reflective notching forms regions with complete resist loss.

Antireflective coatings such as DARC coatings and BARC coatings have been introduced into the photolithography process in order to reduce problems caused by back reflection. Antireflective coatings absorb radiation used for exposing the photoresist.

Substrate fabrication of semiconductor devices typically produces a number of surfaces comprised of dissimilar materials. Many of these surfaces do not have a uniform height, thereby rendering the wafer thickness non-uniform. For example, as is shown in prior art FIG. 1, the height of a material such as a boro-phosphosilicate glass (BPSG) layer 12 of the wafer section 10, does not have the same height at points 14, 16 and 18. Further, surfaces may have defects such as crystal lattice damage, scratches, roughness, or embedded particles of dirt or dust. For various fabrication processes that are performed, such as lithography and etching, unplanned non-uniformities in height and defects at the surface of the wafer or at the surface of any layer of the wafer must be reduced or eliminated.

One problem encountered with the DARC coating arises when a nitride layer or other type of layer is positioned in contact with the DARC coating. In particular, the problem arises when the layer overlays the DARC coating. It has been observed that the overlying layer, such as a silicon nitride layer, develops microparticles within the layer. The microparticles have a diameter of about 0.13 microns in the nitride film. The microparticles are formed as a result of one or more reactions between the DARC coating and the overlying layer. The microparticles are undesirable because they distort the topography of the silicon nitride surface or other capping surface as well as cause distortion at an interface with the DARC coating as is illustrated at 10 in prior art FIG. 1. The distortion occurs because the thickness of the cap, such as the silicon nitride cap, ranges from about 0.1-to- 0.2 microns, which is within the diameter range of the microparticles.

One approach to preventing or eliminating surface discontinuities includes taking action during fabrication in order to prevent surface height discontinuities from occurring in the first place. The Sasaki Patent, U.S. Pat. No. 5,226,930, which issued Jul. 13, 1993, describes a method for preventing agglomeration of colloidal silica in a silicon wafer. The patent describes forming an aqueous colloidal silicon dispersant from an aqueous sodium silicate solution and mixing a trialylhalosilane with the aqueous colloidal silicon dispersant to form trialkylsilane. With this treatment, colloidal silica is substantially prevented from undergoing gelation during drying. This chemical reaction then prevents a polishing slurry that includes colloidal silica from causing scratches or latent flaws on a wafer surface during polishing of the silicon wafers.

SUMMARY OF THE INVENTION

One embodiment of the present invention includes a method for preventing particle formation in a semiconductor layer overlaying a DARC coating. The method comprises providing a semiconductor construct. A DARC coating is deposited on the semiconductor construct. The DARC coating is treated with a plasma under conditions that effectively prevent the formation of defects in a layer subsequently deposited on top. The treated DARC coating is overlaid with the semiconductor layer.

Another embodiment of the present invention includes a method for making a silicon nitride cap for a semiconductor device that has a substantially uniform topography. The method comprises providing a semiconductor construct and depositing a DARC coating on the semiconductor construct. The DARC coating is deposited with a plasma that comprises $SiH_4$ and $N_2O$. The DARC coating is then treated with a plasma to prevent the formation of defects in a layer subsequently deposited on top. The DARC coating is overlaid with the silicon nitride cap.

One other embodiment of the present invention includes a semiconductor device. The semiconductor device comprises a DARC coating and a layer overlaying the DARC coating. The overlaying layer is substantially free of particles formed by one or more reactions with the DARC coating and the overlaying layer.

Another embodiment of the present invention includes a gate stack. The gate stack comprises a DARC coating and a layer overlaying the DARC coating. The layer is substantially free of particles formed by one or more reactions with the DARC coating and the overlaying layer and has a substantially uniform topography.

DETAILED DESCRIPTION

Figure 1:
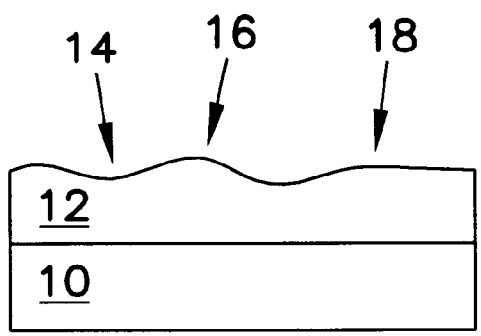
FIG. 1 is a cross sectional prior art view of one embodiment of a gate stack with microparticle formation in a nitride layer.

In the following detailed description of the invention, reference is made to the accompanying drawings which form a part hereof, and in which is shown, by way of illustration, specific embodiments in which the invention may be practiced. In the drawings, like numerals describe substantially similar components throughput the several views. These embodiments are described in sufficient detail to enable those skilled in the art to practice the invention. Other embodiments may be utilized and structural, logical, and electrical changes may be made without departing from the scope of the present invention.

For purposes of this specification, the terms "chip", "wafer" and "substrate" include any structure having an exposed surface of semiconductor material with which to form integrated circuit (IC) structures. These terms are also used to refer to semiconductor structures during processing, and may include other layers that have been fabricated thereupon. The terms include doped and undoped semiconductors, epitaxial semiconductor layers supported by a base semiconductor or insulator, as well as other semiconductor structures well known in the art. The term "conductor" is understood to include semiconductors, and the term "insulator" is defined to include any material that is less electrically conductive than the materials referred to as "conductors." The following detailed description is, therefore, not to be taken in a limiting sense.

One embodiment of the present invention comprises a method for reducing small particle formation in a nitride film or other type of film that overlays a DARC film or coating. The method includes treating a surface of the DARC with an oxygen plasma or a nitrous oxide plasma or treating the DARC surface with ammonia prior to overlaying the DARC coating with the nitride film cap.

"DARC" as used herein refers to a deposited antireflective coating. The DARC material comprises, for example, a silicon-rich oxide, a silicon-rich nitride, or a silicon-rich oxynitride, $Si_xO_yN_z(H)$ or $Si_xO_yN_z$ or $Si_xO_y$: H.

"Nitride" as used herein refers to silicon nitride, $Si_xN_y$, such as $Si_3N_4$, or silicon oxynitride, $Si_xO_yN_z$. Silicon nitride is preferred for use in thin films because it is denser than silicon dioxide. Silicon nitride films may be grown by an exposure of a silicon surface to silicon-based gas such as $SiH_4$ or dichiorosilane, DCS, and ammonia at a temperature of about 500 to 1200 degrees Centigrade. "Semiconductor construct" or "semiconductor profile" as used herein refers to a multi-layered article that has or that is capable of having components of a semiconductor device. The multi-layered article is in a stage of semiconductor service fabrication or is a completed semiconductor device.

The DARC coating that is treated in the process of the present invention has a multiple functionality. In a photolithography process, the DARC coating aids in preventing undesirable light reflection during a step of "setting" a photoresist. The DARC coating is also usable in preventing profile distortion in photolithography fabrication. In particular, the DARC coating does not produce a problem of "footing" in microcomponents of semiconductors. This benefit is particularly important in the fabrication of very small circuitry.

The DARC coating has been found to have desirable photolithographic properties. The DARC coating is more reliable and produces a larger process window with respect to circuit size than other antireflective coatings such as a BARC coating.

The method of the present invention substantially prevents formation of the microparticles by "sealing" the surface of the DARC coating through oxygen plasma treatment or nitrous oxide plasma treatment or through an ammonia ambient heat treatment. It is believed that when the DARC coating is treated with an oxygen plasma, a silicon dioxide barrier is formed on the DARC surface. The silicon dioxide barrier is substantially nonporous and is very hard.

An ammonia heat treatment produces a barrier on the DARC surface that is substantially silicon nitride, $Si_xN_y$. The silicon nitride barrier film is a good diffusion barrier. The silicon nitride barrier is formed by exposing the DARC coating to a silicon-based gas and ammonia at a temperature of about 350 to 1200 degrees Centigrade. The DARC surface treatment, oxygen treatment and ammonia treatment, are believed to render the DARC coating surface substantially non-reactive.

Embodiments of the present invention also include a semiconductor construct or profile that comprises a DARC coating and a capping layer that overlays the DARC coating. The capping layer is substantially free of microparticles and has, in one embodiment, a uniform surface topography. In another embodiment, the surface topography is as desired.

One embodiment of the process of the present invention is summarized in Table 1. The process includes deposition of a plasma that comprises $SiH_4$, to make the [DAR] DARC coating. This step is summarized in Table 1 under "Deposition," "Plasma On", and "$SiH_4$." A next step comprises exposure of the DARC coating to a nitrous oxide plasma or to an oxygen plasma or to an oxynitride plasma. The plasma source is, in one embodiment, a remote plasma source, such as is illustrated schematically at 58 in FIG. 4. An external radio frequency (PF) coil such as is illustrated at 42 in FIG. 3 may be used to generate the plasma gas. This step is designated in Table 1 under "Deposition" as "$N_2O$", "Argon or Helium" and "RF Power." With this plasma generation method, in one embodiment, an oxygen plasma field is generated at one location such as is shown at 60 in FIG. 4 and is transported downstream to a wafer 62 containing a DARC coating. With this method, the plasma is monitored for identification of plasma discharge, ionic recombination, and reduction of electron density.

TABLE 1

| Deposition | RF Purge | Physical Purge |
|---|---|---|
| Plasma On | Argon or He | He or Argon Flow |
| $SiH_4$ | Plasma On | Plasma Off |
| $N_2O$ | RF Power >0 | |
| Ar or He | | |
| RF Power | | |

Figure 5:
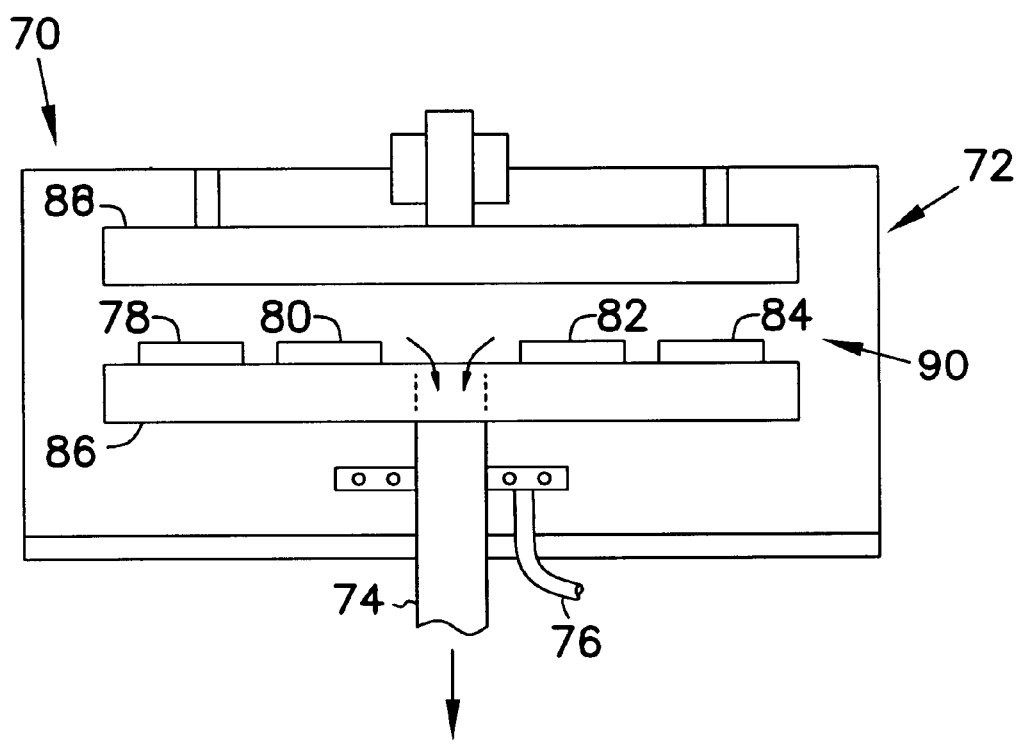
FIG. 5 is a schematic view of one other embodiment of an RF plasma generator used in the process of the present invention.

In another embodiment illustrated at 70 in FIG. 5, a direct plasma generating system 70 includes a chamber 72, a vacuum system 74, and a supply of oxygen or another oxygen source such as nitrous oxide, nitric oxide, or carbon dioxide 76. Wafers 78, 80, 82, and 84 comprising profiles with the DARC coating are loaded into the chamber 72. Pressure within the chamber 72 is reduced and a vacuum is established. The chamber 72 is then filled with oxygen. A power supply creates a radio frequency (RE) field through electrodes 86 and 88 in the chamber 72. The RF field energizes the oxygen to make an oxygen plasma 90. In the plasma state, the oxygen reacts with the surface of the DARC to make silicon dioxide. Radial flow, inverse radial flow, and hot wall reactors may also be used to generate the plasma.

While a radio frequency induced glow discharge field is described, it is believed that other oxygen plasma generating methods may be employed in the method of the present invention. The plasma source may include, in other embodiments, microwave discharges, electron cyclotron resonance sources, high-density reflected electron, helicon wave, inductively coupled plasma, and transformer coupled plasma. Microwave excitation is applied by localized electron cyclotron resonance, surface wave and distributed electron cyclotron resonance.

Figure 3:
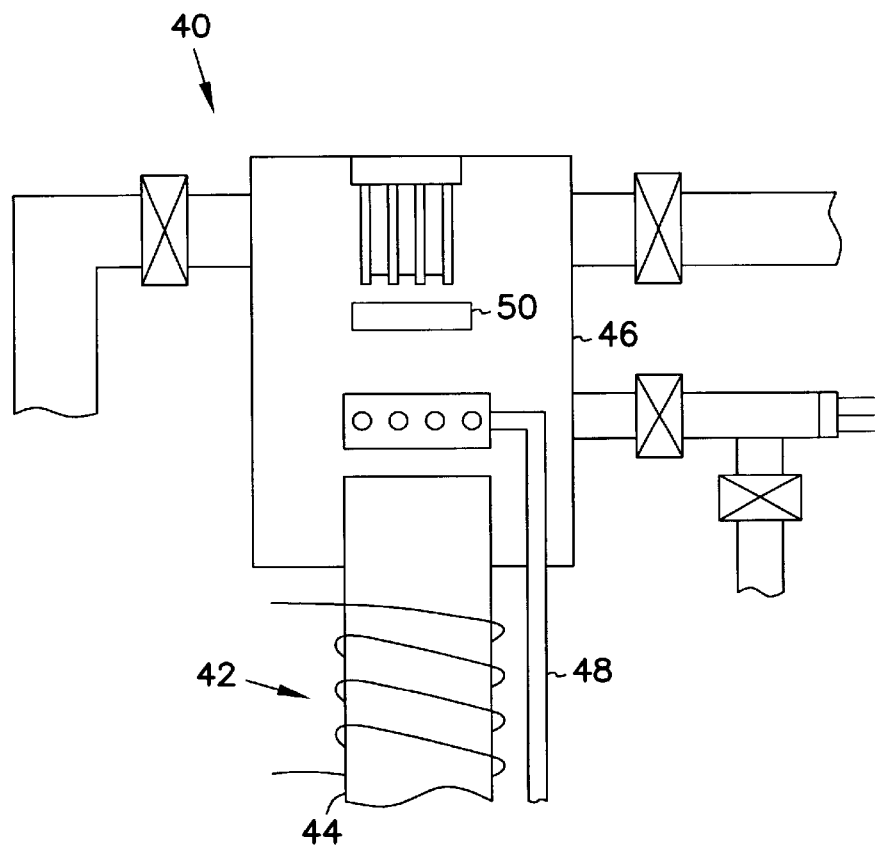
FIG. 3 is a schematic view of one embodiment of an RF source for plasma formation used in the present invention.

One other type of RF plasma generation device is illustrated generally at 40 in FIG. 3. For this generation device, an induction coil 42 is typically wound around a quartz tube 44 appended to one side of a metal vacuum cross-designed for substrate manipulation, and temperature control, shown schematically at 46. The mechanism by which power is imported to the gas stream is through an external inductor or external capacitor. The use of these external devices allows sharp resonant peaks with high Q values to develop in the RF circuit. High Q values produce high fields and high circulating currents.

A process gas is introduced through a plasma tube at 48 where it is ionized and/or dissociated by the RF plasma. Operating pressures are in a range of 1 mTorr to 20 Torr. Reactive species, such as atomic oxygen generated by electron impact dissociation of oxygen gas, diffuse from the plasma region to the substrate surface. Ions generated in the plasma-coil region are "thermalized" during transport from this region to the substrate 50 located downstream from the RF coil 42. An afterglow extending from the plasma coil towards the substrate 50 is often observed under typical pressure and power conditions.

In one embodiment directed to gate stack fabrication, external inductors serve to couple RF power to the plasma gas through a dielectric medium. External coupling eliminates contamination of the gate stack by the electrode material. In the remote RF process such as is illustrated at 50 in FIG. 4, a process gas such as oxygen or nitrous oxide is introduced at 52 or 54 through a plasma tube 56 where it is ionized and/or dissociated by the RF plasma-generating device 58. Operating pressures for the remote process are typically in a range of 5 to 100 mtorr. Operating pressures for the direct plasma generating process range from 1 to 7 Torr.

In the remote plasma generation process, reactive species, such as nitrous oxide or oxygen radicals, generated by electron impact dissociation of $N_2O$ gas or oxygen gas, diffuse from a plasma region 60 to a wafer substrate surface 62. Ions generated in the plasma coil region 60 are "thermalized" during transport from this region to the wafer substrate located downstream from the RF coil. An afterglow extending from a plasma coil toward the substrate is often observed under typical pressure and power conditions. Ions created outside the plasma coil region are not subjected to high E-fields and do not gain significant energy.

Figure 4:
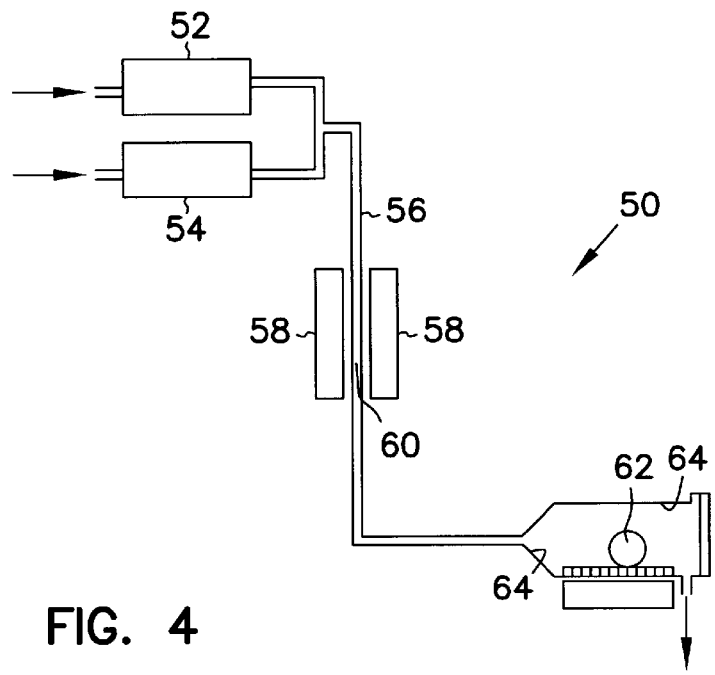
FIG. 4 is a schematic view of one embodiment of an RF plasma generator used in the process of the present invention.

In the plasma generation process shown in FIG. 4, an inert gas plasma dissociates molecular nitrous oxide or oxygen or ammonia downstream from an RF coil which is positioned schematically at 58. A noble gas such as argon discharge or helium discharge acts as a mechanism to couple energy through electrons, ions and metastables, into nitrous oxide or other oxide which is introduced downstream near the sample. Argon or helium or other inert gas or mixture of inert gases is added to the process at 52 or 54. This indirect process minimizes interactions of nitrous oxide or oxygen with a reactor wall 64 by minimizing the contact area of the nitrous oxide or oxygen with the wall 64.

The plasma, mixed with argon or helium or other inert gas, is reduced in power and, consequently, in energy. The plasma is then purged from the site of fabrication of the DARC coating. Once treated, the DARC coating is overlaid with a silicon nitride film.

Figure 2:
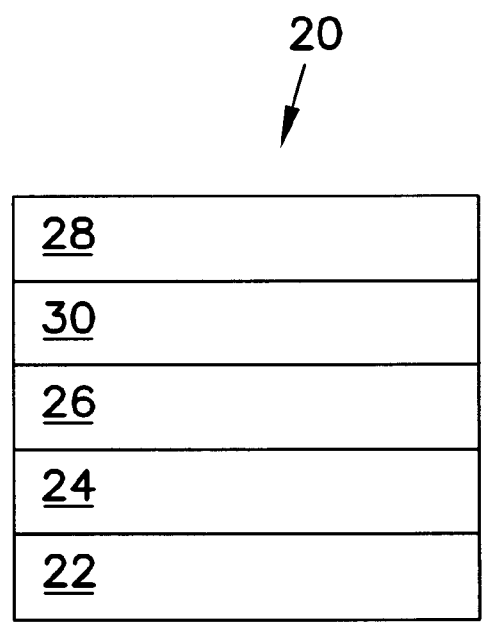
FIG. 2 is a cross sectional view of one embodiment of a gate stack of the present invention, free from microparticles in a nitride cap.

In one embodiment illustrated at 20 in FIG. 2, the method of the present invention is used to fabricate a component such as a gate stack. The gate stack includes a bottom silicon field oxide layer 22. A polysilicon layer 24 overlays the field oxide layer. The polysilicon is, in one embodiment, deposited on the field oxide 22 at a temperature of about 500 to 650 degrees Centigrade. The deposition may take place with a gas stream that is one-hundred percent silane or with gas streams comprised of nitrogen or hydrogen or oxygen or combinations of these materials. The polysilicon layer 24 may have an order ranging from amorphous to columnar polycrystalline silicon. The use of hydrogen gas tends to reduce grain size. Dopants may be added as appropriate for specific applications.

The polysilicon layer 24 is overlaid with a layer of tungsten silicide 26. The tungsten silicide layer acts as a dielectric. The tungsten silicide layer is formed by deposition of $WF_6$ gas with $SiH_4$ to form $WSi_2$. The deposition occurs, in one embodiment, in a chemical vapor deposition, CVD, method.

The tungsten silicide layer 26 is overlaid by the DARC coating 30. The DARC coating 30 is also deposited and is then exposed to a gas stream that comprises oxygen or nitrogen or ammonia or $N_2O$ plasma in order to "inactivate" the surface of the DARC coating. The gas stream is mixed with argon gas or other inert gas such as helium.

Once the DARC coating is deposited, an RF purge is performed. The RF purge is performed in the presence of argon or helium or other inert gas and in the presence of plasma With the RF purge, the DARC coating is exposed, in one embodiment, to a plasma of oxygen and argon or helium or other inert gas. This step is designated in Table 1 as the "RF Purge." The RF purge is followed by a purge whereby a flow of argon gas or helium gas or other inert gas is continued and the plasma supply is stopped.

A silicon nitride layer 28 overlays the DARC coating 30. The silicon nitride layer 28 caps the gate stack 10. The silicon nitride layer 28 has a thickness of 0.1 to 0.2 microns. The silicon nitride may be deposited by a conventional LPCD or by a plasma enhanced chemical vapor deposition, PECVD.

Although specific embodiments have been illustrated and described herein, it will be appreciated by those of ordinary skill in the art that any arrangement which is calculated to achieve the same purpose may be substituted for the specific embodiment shown. This application is intended to cover any adaptions or variations of the present invention. Therefore, it is manifestly intended that this invention be limited only by the claims and the equivalents thereof.

What is claimed is:

1. A method for preventing defect formation in a semiconductor layer overlaying a DARC coating, comprising:

providing a semiconductor construct;

depositing a DARC coating on the semiconductor construct;

exposing the DARC coating to an atmosphere comprising ammonia that effectively prevents a formation of defects in the semiconductor layer; and overlaying the exposed DARC coating with the semiconductor layer.

2. The method of claim 1 and further including energizing the atmosphere prior to exposing the DARC coating to the atmosphere.

3. The method of claim 2 wherein the atmosphere is energized to make a plasma.

4. The method of claim 3 wherein the plasma is made with a radio frequency energy source.

5. The method of claim 2 wherein the atmosphere is energized with heat.

6. The method of claim 1 wherein the DARC coating is deposited on a metallized layer.

7. The method of claim 1 and further including providing a plasma comprising $SiH_4$ and $N_2O$ to make the DARC coating.

8. The method of claim 1 and further including purging the atmosphere prior to overlaying the DARC coating.

9. The method of claim 1 wherein the atmosphere is energized substantially concurrently with contact with the DARC coating.

10. The method of claim 1 wherein the atmosphere is energized prior to contact with the DARC coating.

11. The method of claim 1 and further including diluting the atmosphere with an inert gas.

12. A method for making a silicon nitride cap for a semiconductor device that has a substantially uniform topography, comprising:

providing a semiconductor construct;

depositing a DARC coating on the semiconductor construct;

exposing the DARC coating to an atmosphere that effectively prevents a formation of defects in the silicon nitride cap; and overlaying the DARC coating with the silicon nitride cap.

13. The method of claim 12 and further including energizing the atmosphere prior to exposing to the DARC coating to the atmosphere.

14. The method of claim 13 wherein the atmosphere is energized to make a plasma.

15. The method of claim 14 wherein the plasma is made with a radio frequency energy source.

16. The method of claim 13 wherein the atmosphere is energized with heat.

17. The method of claim 12 wherein the DARC coating is deposited over a metallized layer of the semiconductor device.

18. The method of claim 12 and further including purging the atmosphere prior to overlying the DARC coating.

19. The method of claim 12 wherein the atmosphere is energized substantially concurrently with the DARC coating.

20. The method of claim 12 wherein the atmosphere is energized prior to contact with the DARC coating.

21. The method of claim 12 and further including diluting the atmosphere with an inert gas.

* * * * *

UNITED STATES PATENT AND TRADEMARK OFFICE
CERTIFICATE OF CORRECTION

PATENT NO.    : 6,291,363 B1                                             Page 1 of 1
DATED         : September 18, 2001
INVENTOR(S)   : Zhiping Yin, Gurtej Singh Sandhu It is certified that error appears in the above-identified patent and that said Letters Patent is hereby corrected as shown below:

Column 3,
Line 55, insert new paragraph beginning with "'Semiconductor construct' ..."

Column 4,
Line 35, delete "[DAR]" before "DARC".
Line 42, delete "(PF)" and insert -- (RF) --, therefor.

Column 5,
Line 2, delete "(RE)" and insert -- (RF) --, therefor.

Column 6,
Line 45, insert -- . -- between "plasma" and "with".

Column 8,
Line 7, insert -- comprising ammonia -- between "atmosphere" and "that".
Line 12, delete "to" between "exposing" and "the DARC".

Signed and Sealed this

Twentieth Day of August, 2002

Attest:

Attesting Officer

JAMES E. ROGAN
Director of the United States Patent and Trademark Office